United States Patent [19]

Arakawa

[11] Patent Number: 4,503,519
[45] Date of Patent: Mar. 5, 1985

[54] SEMICONDUCTOR NON-VOLATILE MEMORY ELEMENT OF AN ELECTRICALLY ERASABLE TYPE

[75] Inventor: Hideki Arakawa, Yokohoma, Japan

[73] Assignee: Fujitsu Limited, Kawasaki, Japan

[21] Appl. No.: 359,706

[22] Filed: Mar. 19, 1982

[30] Foreign Application Priority Data

Mar. 25, 1981 [JP] Japan .................................. 56-43501

[51] Int. Cl.³ .............................................. G11C 11/40
[52] U.S. Cl. ..................................... 365/104; 365/185
[58] Field of Search ................. 365/94, 103, 104, 174, 365/182, 185

[56] References Cited

U.S. PATENT DOCUMENTS

| 4,288,863 | 9/1981 | Adam | 365/104 X |
| 4,342,099 | 7/1982 | Kuo | 365/104 |
| 4,366,555 | 12/1982 | Hu | 365/104 X |
| 4,412,310 | 10/1983 | Korsh et al. | 365/104 X |

FOREIGN PATENT DOCUMENTS 0047153 3/1982 European Pat. Off. .
2005915A 4/1979 United Kingdom .

OTHER PUBLICATIONS

IBM Technical Disclosure Bulletin, "Floating Gate Field-Effect Transistor Memory", by Chiu et al., vol. 16, No. 2, Jul. 1973, pp. 619–620.
Applied Physics Letters, "A New Approach for the Floating-Gate MOS Non-volatile Memory", by Han-Sheng Lee, vol. 31, No. 7, Oct. 1, 1977, pp. 475–476.
Journal of Electrochemical Society, "Silicon Oxidation Studies: Morphological Aspects of the Oxidation of Polycrystalline Silicon", by Irene et al., vol. 127, No. 3, Mar. 1980, pp. 705–713.
IEEE, "Electron Trapping in Oxide Grown from Polycrystalline Silicon", by Joh et al., pp. 229–932.
Electronics, "Electrically Erasable Memory Behaves Like a Fast, Nonvolatile RAM", by Chris Wallace, May 10, 1979, pp. 128–131.

Primary Examiner—Robert L. Richardson
Attorney, Agent, or Firm—Staas & Halsey

[57] ABSTRACT

A semiconductor non-volatile memory element of an electrically erasable type includes a floating gate formed on a semiconductor substrate through a first insulating film, and an erase-only or a write/erase gate formed through a second insulating film on the floating gate. The second insulating film is an oxidized film formed by thermal oxidation of polycrystalline silicon having a thickness in the range between 150 and 400 angstroms. Due to such a thin insulating film, the amount of electrons trapped in the second insulating film is greatly decreased so that erasure is possible a greater number of times.

6 Claims, 10 Drawing Figures

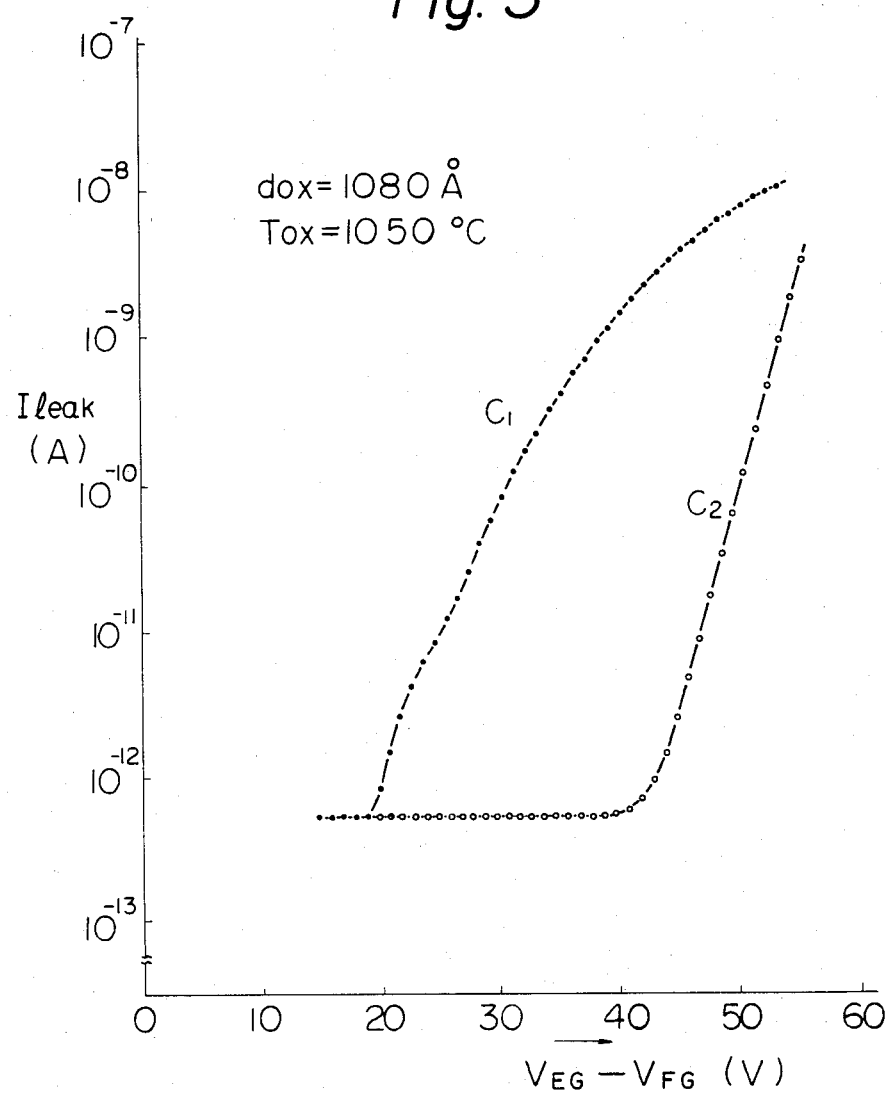

SEMICONDUCTOR NON-VOLATILE MEMORY ELEMENT OF AN ELECTRICALLY ERASABLE TYPE

BACKGROUND OF THE INVENTION

This invention relates to a semiconductor non-volatile memory element of an electrically erasable type, in which the number of possible write/erase cycles is increased.

A typical conventional electrically erasable read only memory (EEPROM) has a two-layer gate structure including a floating gate made of polycrystalline silicon (poly-Si) formed through a first insulating layer on a semiconductor substrate and a control gate formed through a second insulating layer on the floating gate. See, for example "Electron Trapping in Oxide Grown from Polycrystalline Silicon", by Chenming Hu, D. Y. Joh, Y. Shum, and T. Klein, disclosed in CH1504-0/79/0000-0229500.75 ©1979 IEEE, PP 229 through 231. As mentioned in the above reference, writing is achieved by depositing electrons on the floating gate through avalanche or channel-hot electron injection so as to raise the threshold voltage Vt of the transistor. Erasing is effected by removing the electrons from the floating gate across the second insulating layer to the control gate, with the removal rate limited by the Fowler-Nordhein tunnel emission at the poly-Si/SiO$_2$ interface.

The problem in the conventional EEPROM is that the EEPROM becomes useless after a certain limited number of write/erase cycles, because the threshold voltage Vt rises after erasing. It is believed that the fatigue is caused by electron trapping in the second insulating layer formed on the poly-Si floating gate. As the write/erase cycle increases, the density of trapped charge increases causing the electric field at the poly-Si/SiO$_2$ interface to decrease, whereby erasing becomes progressively more difficult.

In the conventional EEPROM, the second insulating layer formed between the poly-Si floating gate and the control gate has a thickness of about 800 through 1500 angstroms formed by thermal oxidation of poly-Si at a temperature of about 800° C. through 1100° C. From here on, the oxide film formed by thermal oxidation of poly-Si is referred to as poly-OX. Such a thick poly-OX formed at such a low temperature causes a great number of electron traps described in detail hereinafter. Therefore, the conventional EEPROM becomes useless only after 100 to 1000 write/erase cycles and cannot be commercially used.

SUMMARY OF THE INVENTION

Accordingly, an object of the present invention is to provide an improved EEPROM which does not become useless even after at least 10,000 write/erase cycles.

Another object of the present invention is to provide an EEPROM which can be commercially used.

According to the present invention, there is provided a semiconductor non-volatile memory element of an electrically erasable type, comprising: a semiconductor substrate; a first insulating film formed on the semiconductor substrate; a floating gate formed on the first insulating film, the floating gate being adapted to receive carriers injected from the side of the semiconductor substrate during a writing operation; a second insulating film formed on the floating gate; and an erase-only or a write/erase gate formed on the second insulating film, the erase-only or the write/erase gate being adapted to receive carriers emitted by an electric field from the floating gate during an erasing operation; characterized in that: the second insulating film comprises an oxidized film having a thickness in the range between 150 to 400 angstroms, formed by thermal oxidation of polycrystalline silicon.

Preferably, the oxidized film is formed by thermal oxidation of polycrystalline silicon included in the floating gate. It is also preferable that the oxidized film is formed at an oxidation temperature approximately in the range between 800° C. and 1050° C.

BRIEF DESCRIPTION OF THE DRAWINGS

The invention will be better understood from the following more detailed description taken in conjunction with the accompanying drawings, in which:

FIG. 3 is a graph of the current-voltage curves between the erase gate and the floating gate in the EEPROM of FIG. 2;

It will be appreciated by those skilled in the art that the figures have not been drawn to scale, but that certain portions have been exaggerated in relative size for clarity of explanation.

DESCRIPTION OF THE PREFERRED EMBODIMENT

Before describing the preferred embodiment, examples of conventional EEPROM's will first be described with reference to FIGS. 1 through 3.

Figure 1:
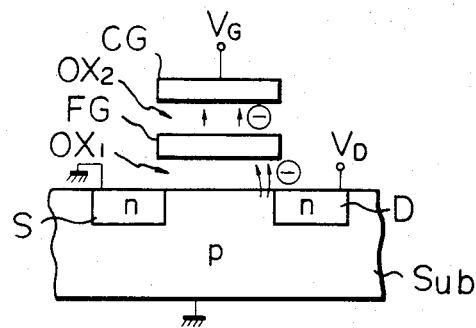
FIGS. 1 and 2 are cross-sectional views taken along the channels of two examples of conventional EEPROM's.

FIG. 1 is a cross-sectional view taken along the channel of a conventional EEPROM. As illustrated in FIG. 1, a semiconductor non-volatile memory device of an electrically erasable type, which is referred to as an EEPROM, has a two-layer gate structure. The EEPROM includes a semiconductor substrate Sub of a first conductivity type (shown illustratively as p-type). In the surface portion of the substrate Sub, source and drain regions S and D of a second conductivity type, opposite that of the first conductivity type i.e., n-type, are formed. The surface of the semiconductor substrate Sub is covered by a first insulating film OX$_1$ which is formed by thermal oxidation of the surface of the semiconductor substrate Sub. Since the semiconductor substrate Sub is made of monocrystal silicon, the first insulating film OX$_1$ is a thin film of SiO$_2$. On the first insulating film OX$_1$, a floating gate FG is formed by polycrystalline silicon. The floating gate FG is covered by a second insulating film OX$_2$. The second insulating film OX$_2$ is covered by a control gate CG.

During operation, the source region S and the substrate Sub are usually grounded. In a writing operation, a voltage $V_D$ of about 16 volts is applied to the drain region D, and a voltage $V_G$ of about 20 volts is applied to the control gate CG. Due to the voltage between the drain region D and the source region S or the substrate Sub, avalanche breakdown occurs, producing hot electrons between the drain region D and the source region S or the substrate Sub. The hot electrons are drawn by the electric field between the control gate CG and the substrate Sub or the source region S and injected into the floating gate FG. Thus the threshold voltage Vt of the memory element is raised.

During an erasing operation, the drain region is grounded, and a higher voltage of, for example, 35 volts is applied to the control gate CG. Due to the intense electric field between the control gate CG and the floating gate FG, the well-known Fowler-Nordheim tunnel emission is effected so that the electrons are removed from the floating gate across the second insulating film $OX_2$ to the control gate CG. Thus, the threshold voltage Vt of the memory element is lowered again.

Conventionally, the second insulating film $OX_2$ is formed by thermal oxidation of the surface of the poly-Si floating gate at a temperature of about 1000° C. and formed as a $SiO_2$ film having a thickness of about 800 to 1500 angstroms. The advantage of forming a poly-OX second insulating film $OX_2$ is that Fowler-Nordheim tunnel emission easily occurs between the floating gate FG and the control gate CG in a relatively weak electric field of about 1 to 2 megavolts/cm. When the thickness of the poly-OX film $OX_2$ is 1000 angstroms, the erasing voltage applied between the control gate CG and the floating gate is about 10 to 20 volts.

However, since there is a coupling capacitance between the floating gate FG and the source region S or substrate Sub, etc., the erasing voltage applied to the control gate CG is about 30 to 40 volts. This voltage is too high for an integrated semiconductor device.

Further, because tunnel emission easily occurs at a relatively low voltage, electrons stored in the floating gate FG easily disappear. That is, when electrons are stored in the floating gate by hot electron injection, the potential at the floating gate FG is lowered so that the voltage between the floating gate FG and the control gate CG is increased. This causes Fowler-Nordheim tunnel emission, during a writing or reading operation, to remove the electrons from the floating gate. Therefore, the conventional memory element of FIG. 1 has the disadvantage of bad retention of information.

Figure 2:
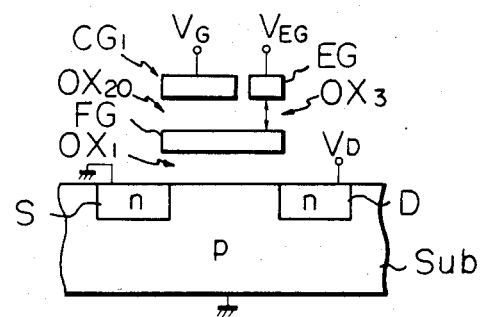

FIG. 2 is an improved example of a conventional EEPROM. The main difference between FIG. 1 and FIG. 2 is that, in place of the control gate CG in FIG. 1, a writing/reading control gate $CG_1$ and an erase-only gate EG are provided. Between the writing/reading control gate $CG_1$ and the floating gate FG, an insulating film $OX_{20}$ is formed by thermal oxidation of poly-Si of the floating gate FG at a relatively high temperature, about 1200° C., which is higher than the $OX_2$ in FIG. 1. The insulating film $OX_{20}$ has the same thickness as that of the second insulating film $OX_2$. Between the erase-only gate EG and the floating gate FG, an insulating film $OX_3$ is formed in the same way as the insulating film $OX_2$, i.e., by thermal oxidation of poly-Si at a relatively low temperature of about 1000° C. The insulating film $OX_3$ has the same thickness as that of the second insulating film $OX_2$. The area of the erase-only gate EG is made small in comparison with the area of the writing/reading control gage $CG_1$. It is well known that such an insulating film such as the film $OX_{20}$, formed by thermal oxidation of poly-Si at a relatively high temperature of about 1200° C., has a better retention characteristic compared with the insulating layer $OX_2$ of FIG. 1, which is formed at a relatively low oxidation temperature. Therefore, the retention characteristic is improved in the memory device of FIG. 2.

In an erasing operation, 0 volts is applied to the writing/reading control gate $CG_1$ and about 20 volts is applied to the erase/only gate EG. In this type of EEPROM, which is provided with the erase-only gate EG, the erasing voltage applied to the erase-only gate EG can be lower than that of the EEPROM in FIG. 1.

However, there is a disadvantage in both devices of FIGS. 1 and 2. That is, because the insulating film $OX_2$ of FIG. 1 and the insulating film $OX_3$ of FIG. 2, which have been formed by thermal oxidation of poly-Si at a temperature of about 1000° C. and having a thickness of about 800 to 1500 angstroms, have too many traps near the poly-Si/$SiO_2$ interface, the density of trapped electrons increases as the write/erase cycle increases. This causes the electric field at the poly-Si/$SiO_2$ interface to decrease and makes erasing progressively more difficult. This disadvantage will be described in more detail with reference to FIG. 3.

FIG. 3 is a graph of the experimental current-voltage curves between the erase gate and the floating gate in the EEPROM of FIG. 2. In FIG. 3, the ordinate represents leakage current I leak between the floating gate FG and the erase-only gate EG caused by Fowler-Nordheim tunnel emission, while the abscissa represents the voltage $V_{EG}-V_{FG}$ between the floating gate FG and the erase-only gate EG. As shown in FIG. 3, the thickness dox of the insulating film $OX_3$ is 1080 angstroms; and the oxidation temperature Tox for forming the insulating film $OX_3$ is 1050° C. The curve $C_1$ represents a current-voltage characteristic determined by the first write/erase cycle. As can be seen from curve $C_1$, the leakage current starts to flow when the voltage $V_{EG}-V_{FG}$ reaches approximately 20 volts. Therefore, in this case, the electrons in the floating gate FG are drawn to the erase-only gate EG by Fowler-Nordheim tunnel emission under an electric field of less than 2 megavolts/cm. In contrast to curve $C_1$, curve $C_2$ represents a current-voltage characteristic determined by another write/erase cycle scores of times after the first write/erase cycle. As can be seeen from curve $C_2$, the leakage current starts to flow only after the voltage $V_{EG}-V_{FG}$ is greater than 40 volts. Therefore, in this case, the electrons in the floating gate FG cannot be drawn unless the electric field is greater than 4 megavolts/cm. In normal operation of the memory device, since the amount of electrons injected into the floating gate by one writing operation is very small, the erasing current in the first erasing operation is very small. In practice, in the first erasing operation, it is not necessary to have a current as large as $10^{-8}$ amperes, as illustrated in the experimental graph of FIG. 3. Therefore, in the first erasing operation, the amount of electrons caught in the traps is very small. Accordingly, curve $C_2$ does not represent the current-voltage characteristic of the insulating film $OX_3$ immediately after the second writing operation, but rather represents the characteristic after scores of writing operations. As mentioned before, when the insulating film is formed at a relatively low oxidation temperature of about 1000° C. and has a thickness ranging between 800 and 1500 angstroms, the traps in the surface between the insulating film $OX_3$ and the floating gate FG will gradually be filled with the electrons only after 100 to 1000 writing operations. Finally, after 1000 or more writing operations, the characteristic curve will be shifted to the right side of the curve $C_2$ so that erasing cannot be effected even when a very high erasing voltage of more than 50 volts is applied between the erase-only gate EG and the floating gate FG. In the situation represented by the curve $C_2$, the trapped electrons cannot be removed even when ultraviolet rays are radiated. Such an EEPROM, which becomes useless after 1000 writing operations, cannot be commercially used.

A common misunderstanding is that the density of the traps is largely independent of the thickness of the poly-Si oxide film formed at about 1000° C. Another misunderstanding is that the erasing voltage is greatly reduced when the thickness of the poly-Si oxide film is decreased. For example, the erasing voltage has been estimated to be about 6 volts when the thickness of the poly-Si oxide film is 300 angstroms. Such a low erasing voltage cannot practically be used because control of the erasing voltage becomes difficult. That is, the reading or writing voltage must be lower than the erasing voltage. When using such a low erasing voltage, erasing may simultaneously occur in a reading or writing operation. Accordingly, it has not been attempted to make the insulating film $OX_3$ as thin as 300 angstroms.

If the insulating film $OX_3$ is formed by thermal oxidation of poly-Si at a relatively high temperature in the range between 1150° C. to 1200° C. and has a thickness between 800 and 1500 angstroms, the nature of the insulating film $OX_3$ will become similar to that of a monocrystal silicon oxide film. Therefore the amount of the traps will be decreased and the retention capability of the memory device will be improved. However, because the leakage current due to Fowler-Nordheim tunnel emission will also be decreased, the erasing voltage must be very high. Further, at such a high temperature, it is difficult to form a thin film of this type for the purpose of decreasing the required erasing voltage. Therefore, an insulating film of this type is not practically used.

However, according to experiments carried out by the inventor, et al of the present invention, it has been found that, even when an oxide film is formed by thermal oxidation of poly-Si at a relatively low temperature of about 1000° C. and has a thickness of about 300 angstroms, the density of the traps is greatly reduced unexpectedly, and the decrease in the voltage causing Fowler-Nordheim tunnel emission is also unexpectedly reduced.

An embodiment of the present invention will now be described with reference to FIGS. 4 through 7.

Figure 4:
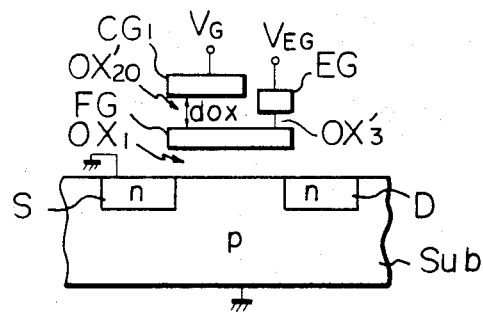
FIG. 4 is a cross-sectional view taken along the channel of an EEPROM, according to an embodiment of the present invention.

FIG. 4 is a cross-sectional view taken along the channel of an EEPROM according to an embodiment of the present invention. In FIG. 4, the same reference characters represent the same portions as in the conventional EEPROM of FIG. 2. The difference between FIG. 2 and FIG. 4 is that, in FIG. 4, a thin insulating film $OX_3'$ is formed under the erase-only gate EG. The thin insulating film $OX_3'$ is formed by thermal oxidation of the surface of the floating gate FG of poly-Si at a temperature in the range between 800° C. and 1050° C. The thin insulating film $OX_3'$ is made of an $SiO_2$ film having a thickness less than the insulating film $OX_{20}'$ under the control gate $CG_1$. Preferably, the thickness of the thin insulating film $OX_3'$ is in the range between 150 to 400 angstroms. In contrast to the above-mentioned oxidation temperature of 1000° C., the oxidation temperature here may be relatively high, in the range between 1050° C. and 1200° C. or more. However, when oxidation is effected at such a relatively high temperature, the oxidation speed is too fast for control of the thickness of the film, so that it is difficult to form a thin film.

Figure 5:
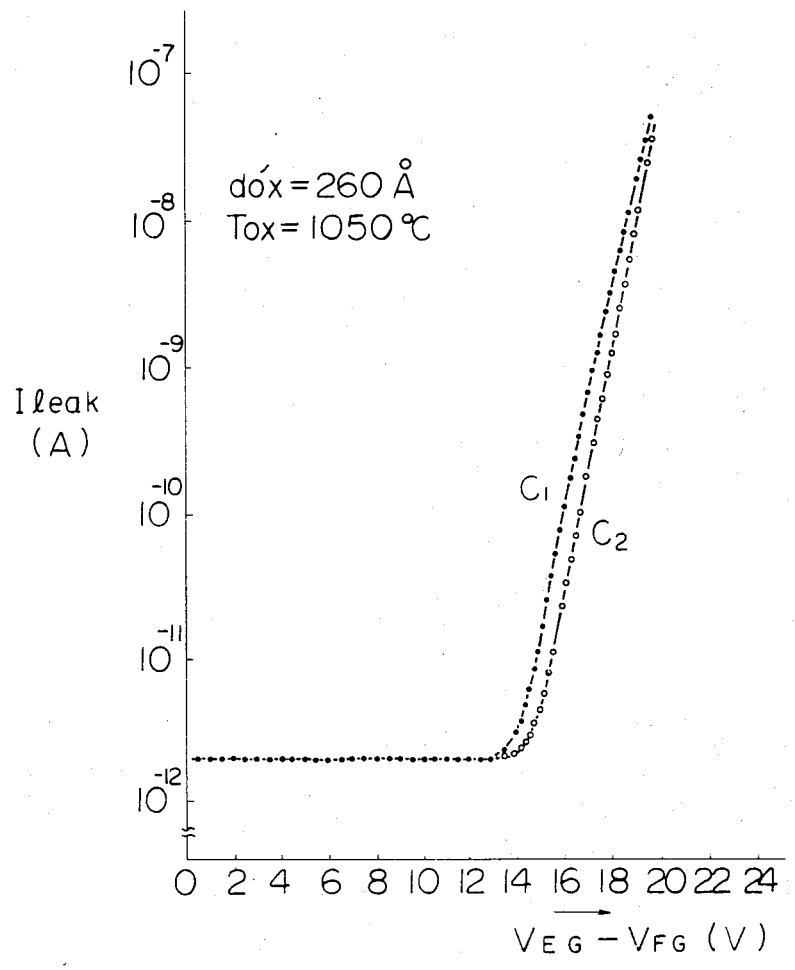
FIG. 5 is a graph of the current-voltage curves between the erase gate and the floating gate in the EEPROM of FIG. 4.

FIG. 5 is a graph of experimental current-voltage curves between the erase-only gate EG and the floating gate FG in the EEPROM of FIG. 4. In FIG. 5, the ordinate and the abscissa represent the same parameters as in FIG. 3. As shown in FIG. 5, the thickness do'x of the insulating film $OX_3'$ is 260 angstroms, and the oxidation temperature Tox is 1050° C. The curves $C_1'$ and $C_2'$ in FIG. 5 also represent current-voltage characteristics determined by the first write/erase cycle and another write/erase cycle scores of times after the first write/erase cycle, respectively. As can be seen from curve $C_1'$, the leakage current starts to flow when the voltage $V_{EG} - V_{FG}$ reaches approximately 14 volts. Since the thickness of the insulating film $OX_3'$ is as low as 260 angstroms, the intensity of the electric field for effecting Fowler-Nordheim tunnel emission is about 5 megavolts/cm in this case. The value of 14 volts is under the tolerance voltage of an integrated circuit. The difference between curves $C_1'$ and $C_2'$ is very small in comparison with curves $C_1$ and $C_2$ of FIG. 3. Therefore, a simple estimate would lead one to expect that $10^5$ or more write/erase cycles would be possible.

Since the insulating film $OX_3'$ under the erase-only gate EG is very thin, it may be considered that the retention capability of information is deteriorated. However, the thin insulating film $OX_3'$ does not seriously affect the retention capability of information, because the area of the insulating film $OX_3'$, i.e., the area of the erase-only gate EG, is very small. No voltage is applied to the erase-only gate EG during a reading or writing operation. Erasing is effected by an unexpectedly high voltage which can be made sufficiently higher than the writing or reading voltage.

Figure 6:
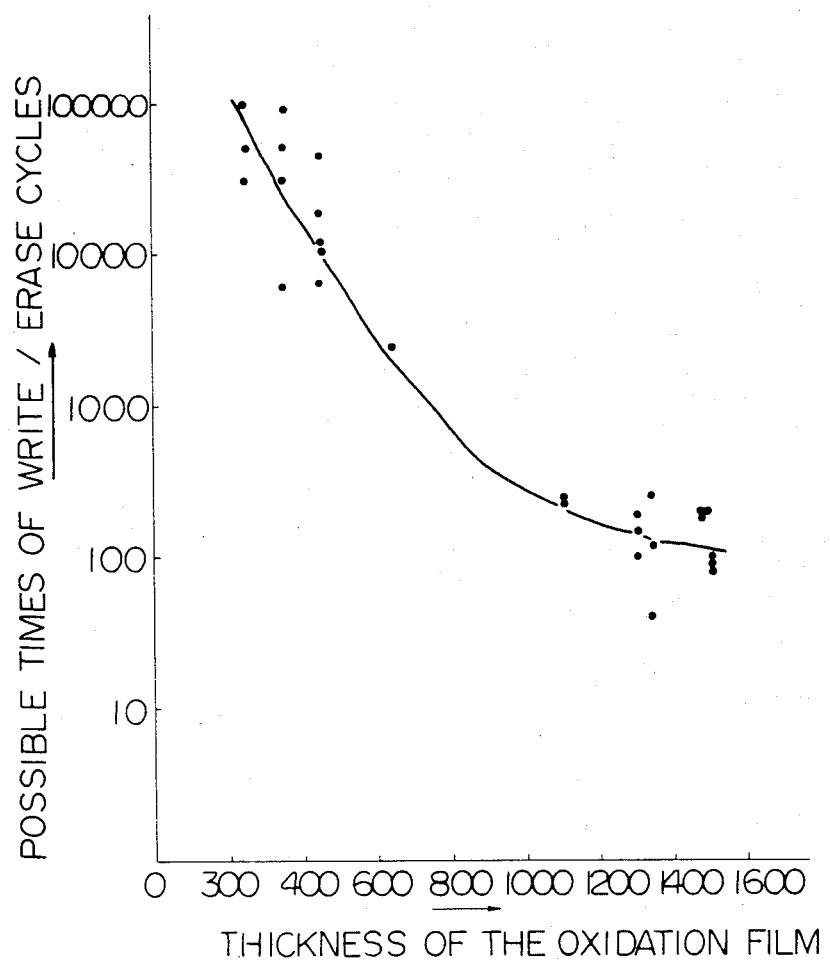
FIG. 6 is a graph of an experimental curve of the relationship between the thickness of the poly-OX film and the possible number of write/erase cycles.

FIG. 6 is an experimental curve of the relation between the thickness of the oxidation film and the possible write/erase cycles. In FIG. 6, the oxidation film is the insulating film $OX_3$ in the conventional EEPROM of FIG. 2 or the insulating film $OX_3'$ in the EEPROM of FIG. 4. As shown in FIG. 6, when the thickness of the oxidation film is in the range between 1000 to 1500 angstroms, there are only less than 300 possible write/erase cycles. In contrast, when the thickness of the oxidation film is in the range between 200 through 500 angstroms, there is a range of between 6000 to 10,000 possible write/erase cycles.

Note that the insulating film $OX_{20}'$ is the same as $OX_{20}$ in the conventional device of FIG. 2, i.e., it is formed by thermal oxidation of poly-Si at a relatively high temperature of about 1200 and has a relatively low thickness of about 1080 angstroms for the purpose of keeping good retention capability. This is because, as mentioned before, a poly-OX film formed at a relatively high temperature of about 1200° C. has a good retention characteristic in comparison with that formed at a relatively low temperature of about 1000° C.

However, if the voltage applied to the control gate $CG_1$ is appropriately controlled so that erasing does not occur during a writing or reading operation, it may be possible to form the insulating film $OX_{20}'$ having the same thickness as that of the insulating film $OX_3'$ at the same oxidation temperature of 1050° C. In this case, the control gate $CG_1$ and the erase-only gate EG are not necessarily separated. Therefore, according to another embodiment of the present invention, it is sufficient that, in the EEPROM of FIG. 1, the second insulating film $OX_2$ has a thickness in the range between 150 to 400 angstroms.

In both embodiments, it is of course meaningless to form the thin poly-OX film by etching a thick poly-OX film having a thickness in the range between 800 to 1500 angstroms. Rather, it is important to form a high quality thin poly-OX film by thermal oxidation of the thin poly-Si layer.

Figure 7A:
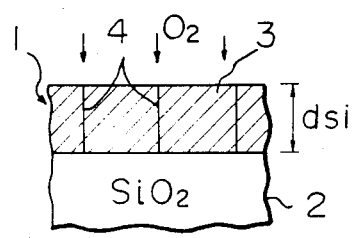
FIGS. 7A through 7D are schematic views of the progressive stages of oxidation of the poly-Si.
Figure 7B:
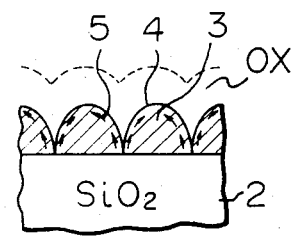

The unexpected small density of traps in the thin poly-OX will be explained in conjunction with FIGS. 7A through 7D which are schematic diagrams of the progressive stages of oxidation of poly-Si. The thermal oxidation of poly-Si is described in detail in the reference J. Electrochem. Soc.: Solid-State Science and Technology, March 1980, entitled "Silicon Oxidation Studies: Morphological Aspects of the Oxidation of Polycrystalline Silicon", pp. 705-711. FIG. 7A shows the idealized grain morphology for poly-Si when it is unoxidized. In FIGS. 7B, a surface layer 1 is a poly-Si layer having a thickness dsi of one grain. The surface layer 1 is formed on a previously prepared oxide film 2. The surface layer 1 includes one layer of poly-Si grains 3 adjacent to each other having boundaries 4. The surface layer 1 will be oxidized from the upper surface of the grains 3 by applying oxygen to the upper surface of the grains 3.

Figure 7C:
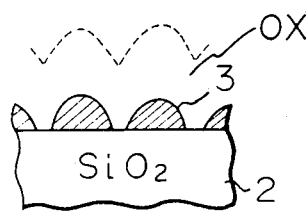
Figure 7D:
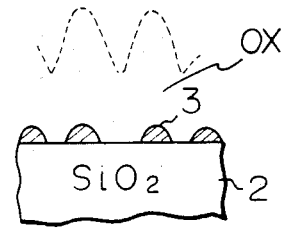

FIGS. 7B through 7D are diagrams of the progressive stages of oxidation. During oxidation, the upper portion of the surface layer 1 is gradually changed from poly-Si to a poly-OX layer OX of $SiO_2$. When poly-Si is oxidized to be $SiO_2$, the volume is approximately doubled. Since the rate of oxidation is higher at each boundary 4 than the surface of the surface layer 1, and since stress due to the volume expansion is exerted during oxidation in the grain boundaries 4 in the arrowed direction 5, the central portion of each grain 3 is projected. As the oxidation proceeds, the projected grains 3 become small, as illustrated in FIGS. 7C and 7D. In practice, however, the oxidation process is more complex because the practical poly-Si layer is much thicker than the illustrated poly-Si surface layer 1 of FIG. 7A. In any case, it is considered that traps are produced in the remaining grains 3 as illustrated in FIG. 7D. That is, once electrons are captured in the remaining grains 3 of FIG. 7D, the captured electrons cannot be removed because the remaining grains 3 are separated from each other and the projected portions of the grains have a high electrical conductivity. If the desired thickness of the oxide layer OX is in the range of 800 to 1500 angstroms, as in the conventional EEPROM, the time required for forming a thick oxide film is so long that the volume of the remaining grains 3 becomes very small, as illustrated in FIG. 7D. However, if the thickness of the insulating film OX is less than 300 angstroms, as in the EEPROM of the present invention, the time for oxidation is so short that the volume of the remaining grains 3 is relatively large as illustrated in FIG. 7B. Therefore, according to the present invention, the density of traps in the poly-OX film is greatly reduced.

From the foregoing description, it will be apparent that, an electrically erasable non-volatile memory element in accordance with the present invention features a greatly increased maximum possible times of erasure and, therefore, greatly improved practical utility.

I claim:

1. A semiconductor non-volatile memory element of an electrically-erasable type, comprising:
    a semiconductor substrate;
    a first insulating film formed on said semiconductor substrate;
    a floating gate comprising polycrystalline silicon, formed on said first insulating film, said floating gate being adapted to receive carriers injected from said semiconductor substrate during a writing operation, and to emit carriers during an erasing operation;
    a second insulating film, formed on said floating gate by a thermal oxidation process, comprising an oxide film formed by thermal oxidation of said polycrystalline silicon in said floating gate, said second insulating film comprising first and second portions, said first portion having a thickness between 150 to 400 angstroms, the thickness being less than that of said second portion;
    an erase-only gate formed on said first portion of said second insulating film, said erase-only gate being adapted to receive the carriers emitted from said floating gate during the erasing operation; and
    a control gate formed on said second portion of said second insulating film.

2. A semiconductor non-volatile memory element as set forth in claim 1, wherein said oxide film is formed at an oxidation temperature approximately in the range between 800° C. and 1050° C.

3. A semiconductor non-volatile memory element as set forth in claim 1, wherein said oxide film is formed at an oxidation temperature approximately in the range between 1050° C. and 1200° C.

4. A semiconductor non-volatile memory element of an electrically erasable type, comprising:
    a semiconductor substrate;
    a first insulating film formed on said semiconductor substrate;
    a floating gate comprising polycrystalline silicon, formed on said first insulating film, said floating gate formed so as to receive carriers injected from said semiconductor substrate during a writing operation and to emit carriers during an erasing operation;
    a second insulating film, formed on said floating gate, by a thermal oxidation process, comprising an oxide film formed by thermal oxidation of said polycrystalline silicon in said floating gate, said second insulating film comprising first and second portions, said first portion having a thickness between 150 to 400 angstroms and being less than that of said second portion;
    an erase-only gate formed on said first portion of said second insulating film, adapted to receive the carriers emitted from said floating gate during the erasing operation; and
    a control gate formed on said second portion of said second insulating film.

5. A method for producing a non-volatile memory element of an electrically erasable type on a semiconductory substrate, comprising the steps of:
    (a) forming a first insulating film on the semiconductor subtrate;
    (b) forming a floating gate, comprising polycrystalline silicon and having first and second portions, on the first insulating film;
    (c) forming a thin insulating film on the first portion of the floating gate, said thin insulting film being a thermal oxide film of the polycrystalline silicon and having a thickness between 150 to 400 angstroms;
(d) forming a second insulating film, having a thickness greater than the thin insulating film, on the second portion of the floating gate;
(e) forming an erase-only gate on the thin insulating film; and
(f) forming a control gate on the second insulating layer.

6. A method for producing a non-volatile memory element as set forth in claim 5, wherein said forming step (c) comprises forming the thin insulating film at a temperature of 800–1050° C. to the thickness of 150–400 angstroms.

* * * * *

UNITED STATES PATENT AND TRADEMARK OFFICE
CERTIFICATE OF CORRECTION

PATENT NO. : 4,503,519
DATED : March 5, 1985
INVENTOR(S) : ARAKAWA

It is certified that error appears in the above-identified patent and that said Letters Patent is hereby corrected as shown below:

Col. 4
Line 9, "erase/only" s/b --erase-only--.

Col. 6
Line 54, "1200" s/b --1200°C.--.

Col. 7
Line 21, "FIGS. 7B" s/b --FIG. 7A--.

Col. 8
Line 68, "insulting" s/b --insulating--.

Signed and Sealed this

Twenty-third Day of July 1985

[SEAL]

Attest:

DONALD J. QUIGG

Attesting Officer     Acting Commissioner of Patents and Trademarks